United States Patent [19]
Johnson et al.

[11] Patent Number: 5,070,039
[45] Date of Patent: Dec. 3, 1991

[54] METHOD OF MAKING AN INTEGRATED CIRCUIT USING A PRE-SERVED DAM BAR TO REDUCE MOLD FLASH AND TO FACILITATE FLASH REMOVAL

[75] Inventors: Richard E. Johnson, Carrollton; Dennis D. Davis, Garland; David R. Kee; John W. Orcutt, both of Richardson, all of Tex.; Angus W. Hightower, Singapore

[73] Assignee: Texas Instruments Incorporated, Dallas, Tex.

[21] Appl. No.: 337,609

[22] Filed: Apr. 13, 1989

[51] Int. Cl.⁵ ................., H01L 21/56; H01L 21/84
[52] U.S. Cl. .................... 437/207; 437/214; 437/217; 437//220; 357/70
[58] Field of Search ........ 437/217, 220, 211; 29/827, 838, 841; 361/404, 408, 421; 428/571, 572, 573

[56] References Cited

U.S. PATENT DOCUMENTS 4,490,902  1/1985  Eytcheson et al. .................. 437/217
4,733,014  3/1988  Fierkens et al. .................... 264/276

FOREIGN PATENT DOCUMENTS 59-36955   2/1984  Japan .
62-156844  7/1987  Japan .
63-296256 12/1988  Japan .

Primary Examiner—Olik Chaudhuri
Assistant Examiner—David E. Graybill
Attorney, Agent, or Firm—Richard B. Havill; Melvin Sharp; N. Rhys Merrett

[57] ABSTRACT

A lead from 10 carries an integrated circuit on a die support pad 14. The lead frame has a dam bar including a transverse portion that extends between adjacent leads (20) for limiting mold flash. The dam bar transverse portion 26 is entirely severed from the adjacent leads for final removal by a metal punch 33 along with the supporting web 16.

3 Claims, 4 Drawing Sheets

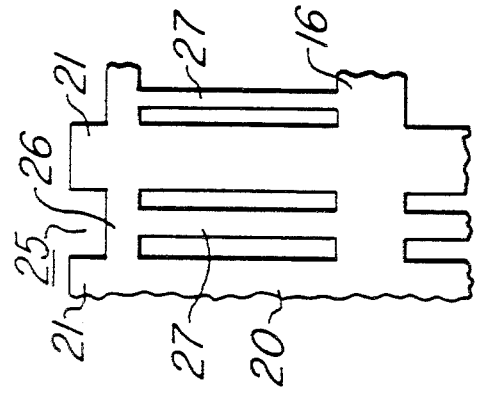
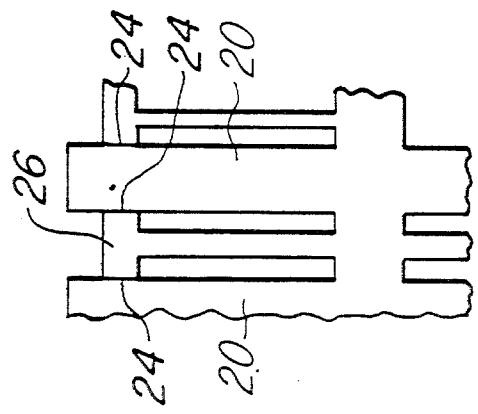
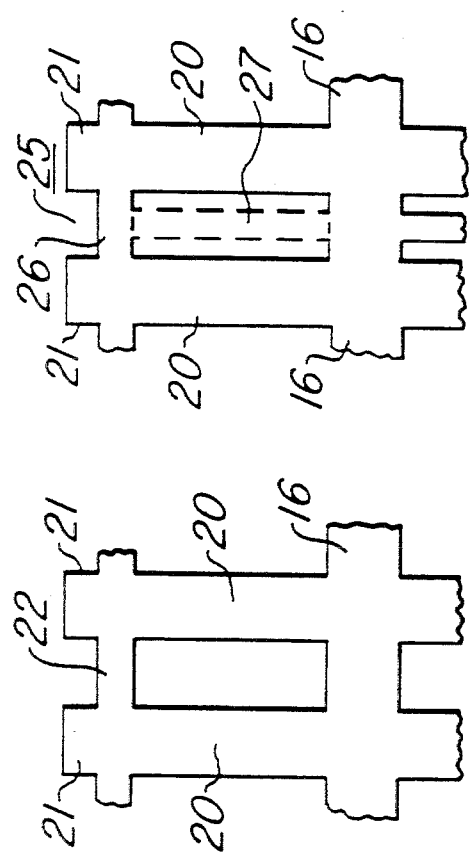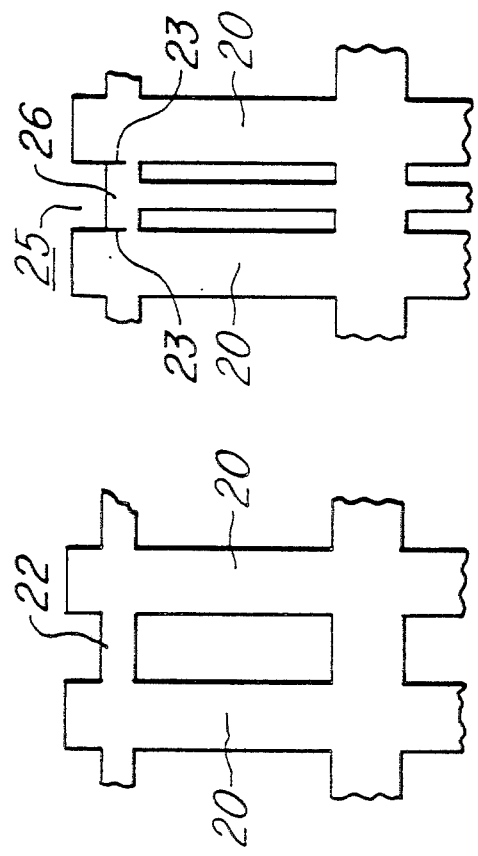
Fig. 4A
Fig. 4B
Fig. 3A
Fig. 3B
Fig. 2A (PRIOR ART)
Fig. 2B (PRIOR ART)

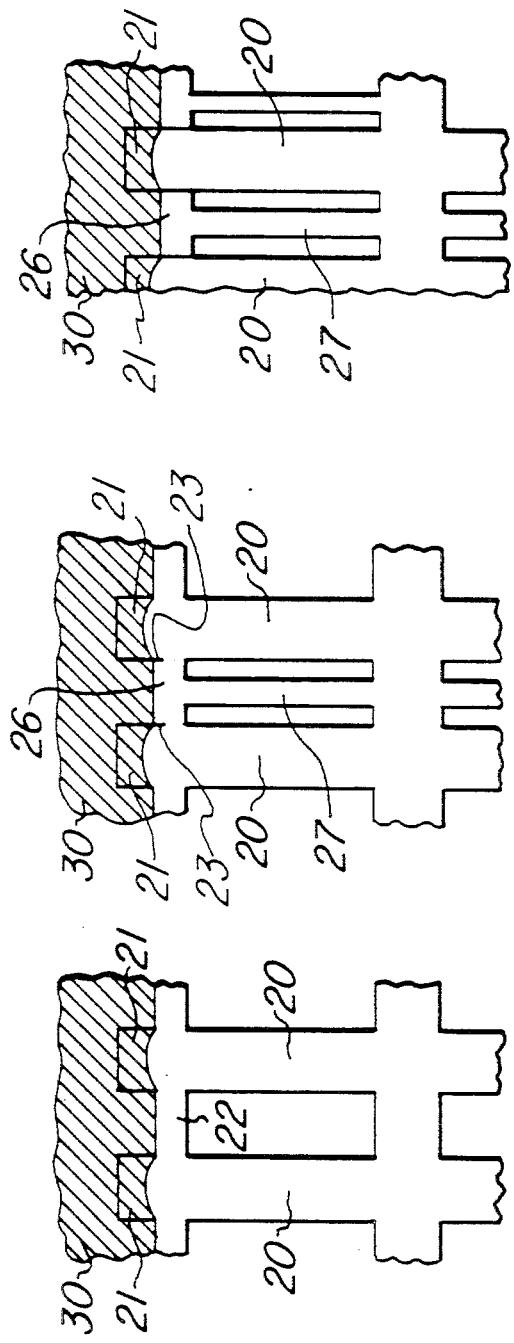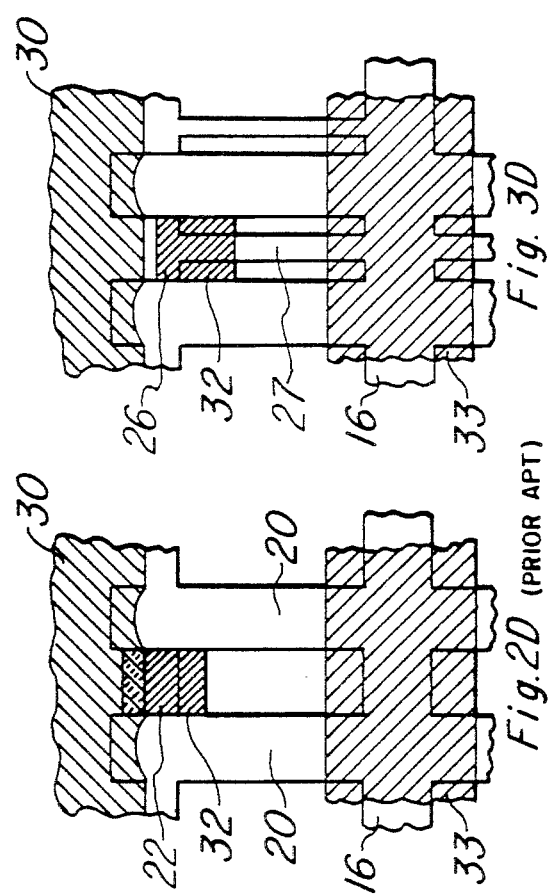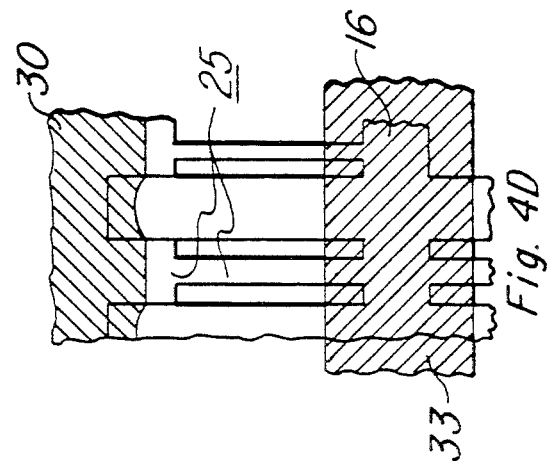

METHOD OF MAKING AN INTEGRATED CIRCUIT USING A PRE-SERVED DAM BAR TO REDUCE MOLD FLASH AND TO FACILITATE FLASH REMOVAL

BACKGROUND

This invention relates to the assembling and packaging of integrated circuit devices and, more particularly, to a lead frame for such devices, a method for trimming and forming an encapsulated device, and to an improved encapsulated device.

It is known to encapsulate integrated circuits with plastic. See, for example, U.S. Pat. No. 4,043,027, the disclosure of which is here incorporated by reference. Integrated circuits in the form of semiconductor dies are first attached to a support pad of the lead frame. Contact or bond pads on the semiconductor device are then individually attached by wire bonding to corresponding contact pads on the ends of the leads.

After the wire bonding operation is completed, the lead frame is placed in a mold. The mold is provided with a reservoir for containing a quantity of insulating, molding compound. The molding compound is injected into the mold in order to encapsulate the integrated circuit. Such injection molding is accomplished as mentioned in the aforesaid patent and is further described in U.S. Pat. No. 4,504,435, also incorporated by reference.

It is found useful by those skilled in the art to form the lead frames in a continuous strip. Each lead frame of a strip has an integrated circuit device attached to the support pad as mentioned above. The support pads are themselves supported by a pair of support arms between two parallel siderails. Each siderail is located in the plane of the lead frame and on opposite sides of the die pad. In the popular, so-called dual in-line package, one lead frame serially follows the next. In another so-called matrix package, a plurality of lead frames are disposed between opposing siderails with transverse carrier arms disposed between the two siderails for receiving the support arms of the die pad.

In the molding operation, mold cavities are formed around the lead frames to tightly close and seal upon the leads themselves as well as the dam bar. The dam bar has a transverse portion that extends between a pair of adjoining leads. The dam bar restricts the flow of encapsulated material from the enclosed lead frame. After encapsulation, the dam bar and a portion of the mold flashing projecting between adjoining leads is removed by a punch. The punch is the typical metal punch that readily severs the metallic dam bar and also removes a portion of the projected mold flashing from between the lead frames.

The removal of the mold flashing by the dam bar punch presents several problems. The molding compound itself includes abrasive material such as silicon dioxide. This abrasive material wears away the cutting edge of the dies thereby reducing their useful life. Moreover, as the dies wear out, the flashing is unevenly and jaggedly removed. As such, the portion of the flashing remaining between the leads has a jagged edge. Such a jagged edge mold flashing causes further problems when automatic machinery is used to insert the encapsulated integrated circuit into tightly packed printed circuit boards. The extraneous, jagged mold flashing interferes with such automatic insertion machinery thereby decreasing the efficiency and speed of the final assembly of an electronic device.

As such, there has arisen a need for an improved lead frame for producing an encapsulated integrated circuit that has outside edges that are well defined by the molding process itself without the need for mold flash removal by a metal cutting die. There has also developed a further need for reducing the extent of the mold flashing so that such flash is within acceptable tolerance limits of automatic insertion machines. There is also a need for improving the trim and forming operations in the manufacture of an integrated circuit to increase the longevity of the dies that are used to sever the lead frame from its siderails.

SUMMARY OF THE INVENTION

The invention as further described and claimed herein meets the unfulfilled needs of the prior art. In particular, the invention provides for a dam bar having a transverse portion disposed between each pair of adjoining leads. The transverse portion of the dam bar is entirely severed from the leads. The severance is made on that portion of the dam bar that is proximate to the molding compound. As such, when a punch is brought down to remove the dam bar, the punch can clear the extruded mold flash and only needs to sever the lateral portion of the dam bar, which extends to a supporting web.

In one embodiment of the invention, the dam bar is provided with transverse and transverse portions. The lateral portion extends between two adjoining leads and is severed from both leads and press fit back into place. The dam bar is connected by its lateral portion to a support web that supports other dam bars and the leads. During the trim and forming operation, the supporting web and all of the dam bars are removed by a single punch. When the supporting web is punched out, the previously severed dam bars fall away from the molding compound. That punch is far removed from the molding compound and thus the life of the punch will depend substantially only upon its metal wear rather than upon the abrasive wear due to passing through molding compound.

The invention thus provides an improved process for the assembly of an integrated circuit. This process includes the steps of providing a lead frame with at least one pair of adjoining leads, the lead frame having a dam bar with a transverse portion extending between the leads. The transverse portion of the dam bar is entirely severed from the leads prior to encapsulation. After the integrated circuit is placed on the die pad of the lead frame, and otherwise wire bonded to the leads, the integrated circuit is encapsulated with an insulating, molding compound. In this manner, the outer edge of the molding compound between the two leads is defined by the severed dam bar. The dam bar is finally removed from a supporting web and the leads are formed to their desired shape.

As such, the inventive process results in an overall new integrated circuit. The integrated circuit has a molded insulating material encapsulating the die. In particular, the outer edge of the encapsulating material disposed between adjoining leads is defined by an uncut edge. That edge conforms to the dimensions of the removed dam bar. Such an edge is believed unique inasmuch as the corresponding edge of all prior art devices is defined by a cutting process whereby certain portions of the mold flash between adjoining leads are removed by severing the mold compound with a metallic punch.

DESCRIPTION OF THE DRAWINGS

FIGS. 2A-2E are a series of partial plan schematic views of a prior art encapsulation and trimming process;

FIGS. 3A-3E are partial plan broken away schematic views of one embodiment of the inventive apparatus in process;

FIGS. 4A-4D are partial plan broken away mechanical schematic views of another embodiment of the inventive apparatus and inventive process;

DETAILED DESCRIPTION

Figure 1:
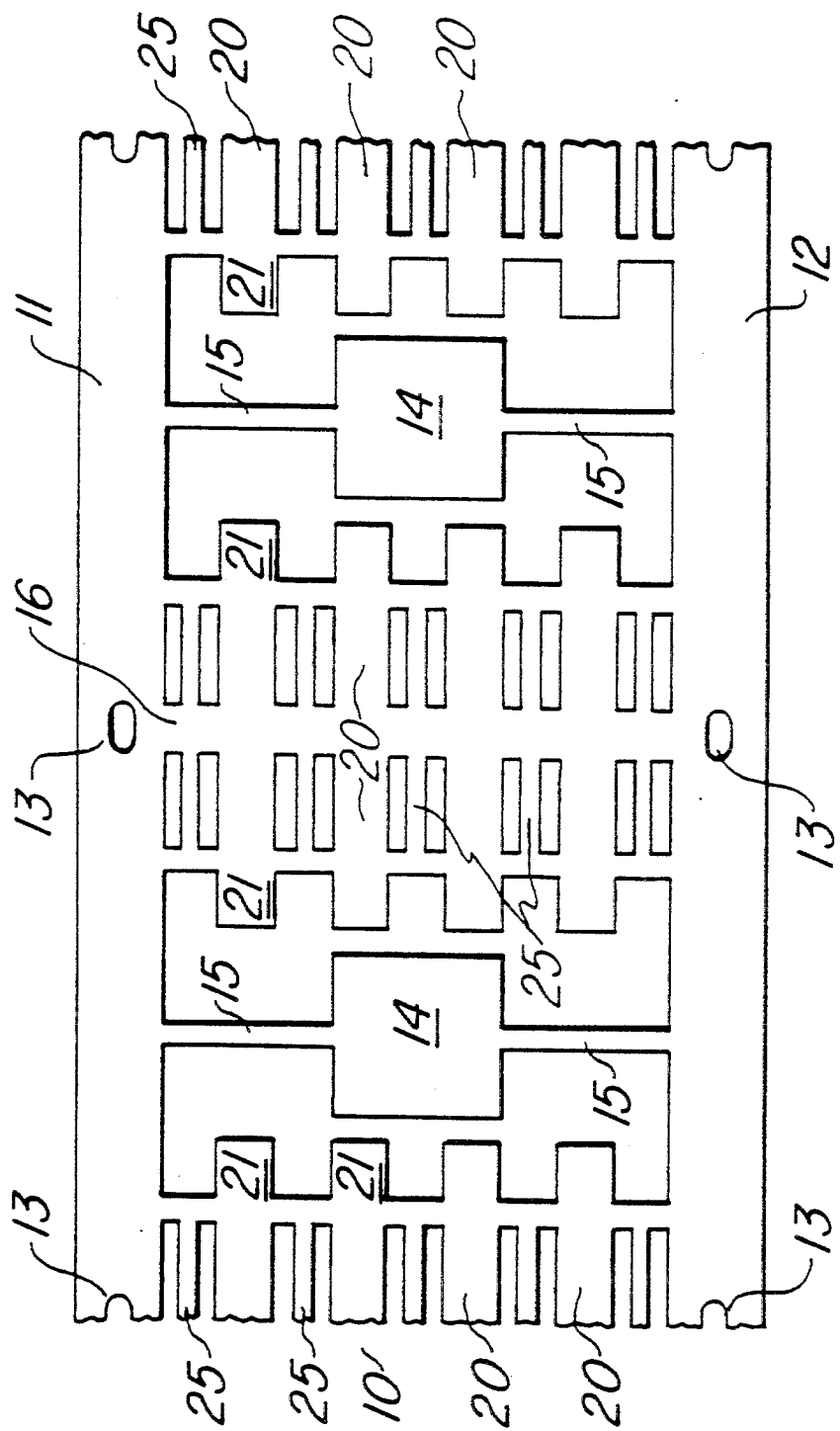
FIG. 1 is a partially broken away schematic plan view of two dual in line lead frames.

Turning now to FIG. 1, there is shown a lead frame 10 having a pair of spaced apart, parallel siderails 11, 12. The siderails 11, 12 are provided with a plurality of alignment apertures 13 that are used to transport and align the lead frame 10 through the use of pins or sprockets (not shown) that project through apertures 13. Pairs of support arms 15 extend inwardly from the siderails 11 and 12. Disposed between each pair of inwardly projecting support arms 15 is a die pad 14. The integrated circuit will be positioned on and bonded to the pad 14 at a later point in assembly.

A plurality of leads 20 extend inwardly toward the die pad 14 from a transverse supporting web 16. Also extending from web 16 are a plurality of dam bars 25. Dam bars are disposed between the siderails 11,12 and the respective first lead 20 spaced from those siderails, as well as between adjoining pairs of leads 20.

Figure 2E:
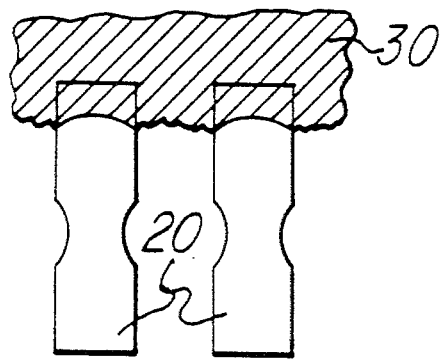

With reference to the prior art process, the dam bar 22 of the prior art is disposed between adjoining leads 20 as shown in FIGS. 2A and 2B. The dam bar 22 is spaced a sufficient distance from the ends of the leads to account for tolerance of the punch. In FIG. 2C, a molding compound 30 is applied to the lead frame 10 and covers the end portions 21 of the leads 20. The trimming operation of the prior art is shown in FIG. 2D. There, punches 33 and 32 respectively remove the transverse supporting web 16 as well as the dam bar 22 and a portion of the mold flash 30 that projects between adjoining leads 20. The double cross-hatched portion shown in FIG. 2D indicates the portion of the molding compound 30 that is removed by the dam bar punch. Over time, the dam bar punch wears and as a result the edge of the molding compound 30 disposed between adjoining leads 20 assumes a ragged or jagged profile as shown in FIG. 2E. Such a profile may be repeated on the corners of the molded portion of the integrated circuit. Such jagged flashings often require secondary flash removal or else they may interfere with automatic insertion equipment.

One embodiment of the inventive device is shown in FIG. 3A. There, the leads 20 have a dam bar 25 including a transverse portion 26 that is initially integral with adjoining leads 20. In the following description, a lateral portion 27 of dam bar 25 is optional. Those skilled in the art will appreciate from the following description how the lateral portion 27 may be omitted.

The dam bar 25, as shown in FIG. 3B, is partially severed along lines 23. The severance 23 extends preferably one-third to one-half the width of the transverse portion 26. The length of the severance is sufficient to allow a trimming punch to remove and completely sever the transverse portion 26 without passing through a molding compound.

Figure 3E:
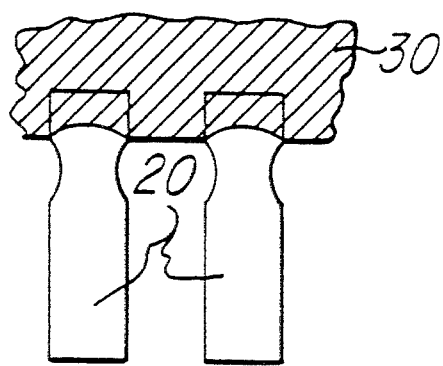

As shown in FIG. 3C, the molding encapsulant 30 covers the ends 21 of leads 20. The dam bar 25 transverse portion 26 has its severance lines 23 extending outside the molding compound 30. In a further process step as shown in FIG. 3D, a punch 32 completes the severance of dam bar transverse portion 26. A further punch 33 also severs the transverse supporting web 16 together with the lateral portion 27 of dam bar 25. The resultant profile of the molding portion between two adjoining leads 20 is shown in FIG. 3E. As will be seen therein, the outline of the molding compound 30 between two adjoining leads 20 is uncut and thus solely defined by the removed dam bar 25.

FIGS. 4A-4D show a further embodiment of the invention where the dam bar 25 has the transverse portion 26 entirely severed from adjoining leads 20. With reference to FIGS. 4A and 4B, the embodiment shows a transverse portion 26 that is entirely severed along lines 24. After severance, the dam bar 25 transverse portion 26 is press fitted back into place in order to form a solid dam against the subsequent mold compound. As further shown in FIG. 4C, the mold compound 30 covers the ends 21 of adjoining leads 20 and fills the space between the adjoining leads up to the dam bar 25 transverse portion 26.

The trim and form operation is shown in FIG. 4D. There, a single punch 33 is used to remove the dam bar 25 and transverse support web 16. As such, this embodiment reduces the number of punching surfaces so that only one punch, 33, is required. So this embodiment reduces the number of punching surfaces and the single punch 33 is distantly spaced from the molding compound 30 so there is no possibility of its encountering the abrasive material of the molding compound. The resultant outline of the encapsulated device is shown in FIG. 3E as it is substantially identical to the outline of the device made in accordance with the process discussed in FIGS. 3A-3D.

Figure 5:
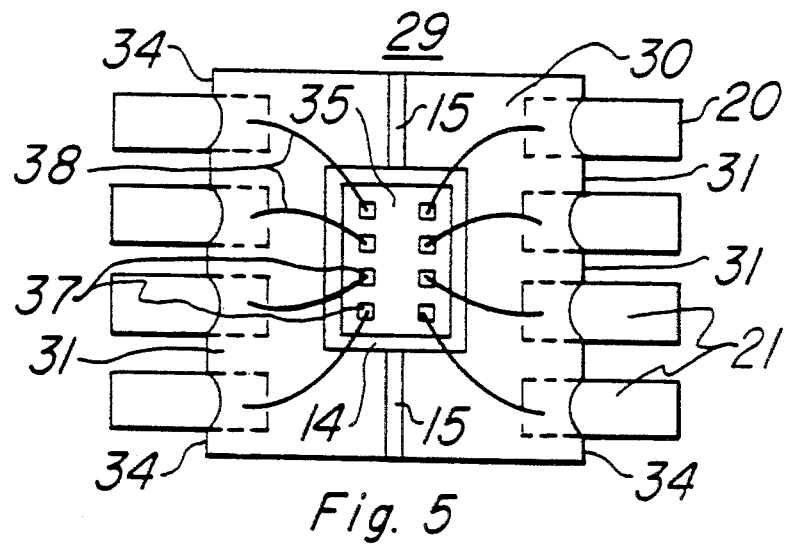
FIG. 5 is a plan schematic view of an encapsulated small outline package made in accordance with the invention.

Turning to FIG. 5, there is shown an integrated circuit 35 mounted on a die pad 14 and encapsulated in a molding compound 30. The integrated circuit 35 has a plurality of bond pads 37 that are bonded by wires 38 to corresponding lead ends 21. The edge 31 of the molding compound between adjoining lead ends as well as the corner edges 34 are uncut edges that are substantially defined by the dam bar that has been removed. Thus, the edges 31 and 34 are molded edges rather than cut or otherwise trimmed edges.

Figure 6:
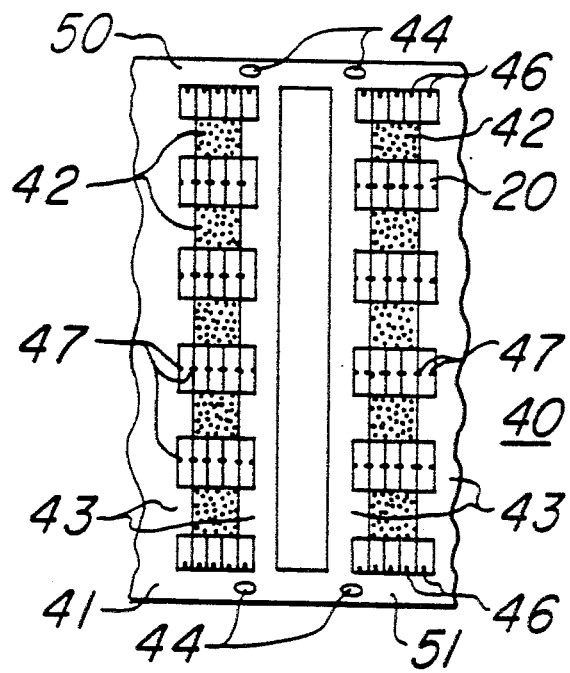
FIG. 6 is a plan view of a matrix lead frame including a plurality of small outline packages made in accordance with the invention.

Refer to FIG. 6. As mentioned above, the preferred embodiment for practicing the invention includes a matrix lead frame 40. The lead frame 40 includes a plurality of molded integrated circuits 42 that are disposed between opposing siderails 50 and 51. Alignment apertures 44 and siderails 50,51 are provided for sprockets that advance and align the matrix lead frame 40 through its processing steps. Leads 20 extend between spaced apart encapsulated integrated circuits 42. The dam bars, including lateral portions 27, have been removed by a prior operation leaving only certain burr ends 46 on the adjoining leads. In a further operation, the leads between adjoining integrated circuits 42 will be separated along the line formed by the burr ends 46 of the dam bar lateral portions 27. Siderails 50,51 have further ends 46 of the dam bars that have been removed during a prior operation. As will be seen, the matrix 40 includes further transverse carriers 43 extending between siderails 50,51 for supporting the edges of the integrated circuits 42. Support arms 15, not shown, extend between opposite carrier arms 43.

Having thus described the embodiments of the invention, those schooled in the art will recognize that further modifications, additions, changes and omissions to the invention may be made using conventional techniques without departing from the spirit and scope of the invention as defined in the following claims.

We claim:

1. A process for assembling an integrated circuit comprising the steps of:

providing a lead frame with at least one pair of adjoining leads and a dam bar having a transverse portion extending between said leads and having a lateral portion, narrower than said transverse portion and extending from the transverse portion to a supporting web;

entirely severing the transverse portion of said dam bar from the leads;

joining an integrated circuit to the leads;

subsequently encapsulating the integrated circuit in an insulating, molding compound;

defining the outer molded edge of the molding compound between the leads with the entirely severed transverse portion of said dam bar; and finally severing the lateral portion of the dam bar from the supporting web.

2. The process of claim 1 wherein before the step of encapsulating the integrated circuit, the entirely severed transverse portion of said dam bar is repositioned between the leads to dam said molding compound.

3. The process of claim 1 wherein before the step of encapsulating the integrated circuit, the entirely severed transverse portion of said dam bar is press fitted into its original position between the leads to dam said molding compound.

* * * * *